United States Patent
Zhao et al.

(10) Patent No.: US 11,613,808 B2
(45) Date of Patent: Mar. 28, 2023

(54) CLEAN PROCESSES FOR BORON CARBON FILM DEPOSITION

(71) Applicant: Applied Materials, Inc., Santa Clara, CA (US)

(72) Inventors: Jiheng Zhao, San Jose, CA (US); Abdul Aziz Khaja, San Jose, CA (US); Prashant Kumar Kulshreshtha, San Jose, CA (US); Fang Ruan, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 232 days.

(21) Appl. No.: 17/077,959

(22) Filed: Oct. 22, 2020

(65) Prior Publication Data
US 2022/0127722 A1    Apr. 28, 2022

(51) Int. Cl.
*C23C 16/04* (2006.01)
*C23C 16/44* (2006.01)
*H01L 21/033* (2006.01)

(52) U.S. Cl.
CPC ...... *C23C 16/4404* (2013.01); *C23C 16/4407* (2013.01); *H01L 21/0337* (2013.01)

(58) Field of Classification Search
CPC ......... C23C 16/04; C23C 16/32; C23C 16/38; C23C 16/4404; C23C 16/4407
See application file for complete search history.

(56) References Cited

U.S. PATENT DOCUMENTS

| | | | | |
|---|---|---|---|---|
| 7,998,881 | B1* | 8/2011 | Wu | H01L 21/02115 438/778 |
| 10,679,830 | B2* | 6/2020 | Bi | H01J 37/32568 |
| 2006/0019031 | A1* | 1/2006 | Furuta | C23C 16/0209 427/248.1 |
| 2006/0093756 | A1* | 5/2006 | Rajagopalan | C23C 16/4404 257/E21.26 |
| 2011/0308453 | A1* | 12/2011 | Su | C23C 16/303 118/708 |
| 2013/0034969 | A1* | 2/2013 | Meng | H01L 21/76819 438/761 |
| 2014/0213059 | A1* | 7/2014 | Doan | H01L 21/31116 438/694 |

(Continued)

OTHER PUBLICATIONS

Kim, Min Su, et al., "Effect of seasoning-layer stress on fluorine diffusion". AIP Advances 10, 085103 (2020); pp. 1-7.*

(Continued)

*Primary Examiner* — Bret P Chen
(74) *Attorney, Agent, or Firm* — Kilpatrick Townsend & Stockton LLP

(57) ABSTRACT

Exemplary semiconductor processing methods may include forming a seasoning film on a heater of a processing chamber by a first deposition process. The method may include performing a hardmask deposition process in the processing chamber. The method may include cleaning the processing chamber by a first cleaning process. The method may include monitoring a gas produced during the first cleaning process. The method may include cleaning the processing chamber using a second cleaning process different from the first cleaning process. The method may also include monitoring the gas produced during the second cleaning process.

15 Claims, 5 Drawing Sheets

(56) References Cited

U.S. PATENT DOCUMENTS

2015/0235816 A1* 8/2015 Yun .................. H01J 37/32834
                                                    118/712
2016/0358804 A1* 12/2016 Kulshreshtha ...... C23C 16/4586
2017/0062218 A1* 3/2017 Duan .................. H01L 21/0335

OTHER PUBLICATIONS

Zeng, Hongjun, et al., "Boron-doped ultrananocrystalline diamond synthesized with an H-rich/Ar-lean gas system". Carbon 84 (2015) 103-117.*
Matsumoto, Ryo, et al., "Concurrent synthesis and boron-doping of amorphous carbon films by focused ion beam-assisted chemical vapor deposition". Thin Solid Films 730 (2021) 138704, pp. 1-4.*
Wang, Lei, et al., "A Flexible and Boron-Doped Carbon Nanotube Film for High-Performance Li Storage". Frontiers in Chemistry, Nov. 2019, vol. 7, Article 832, pp. 1-10.*

* cited by examiner

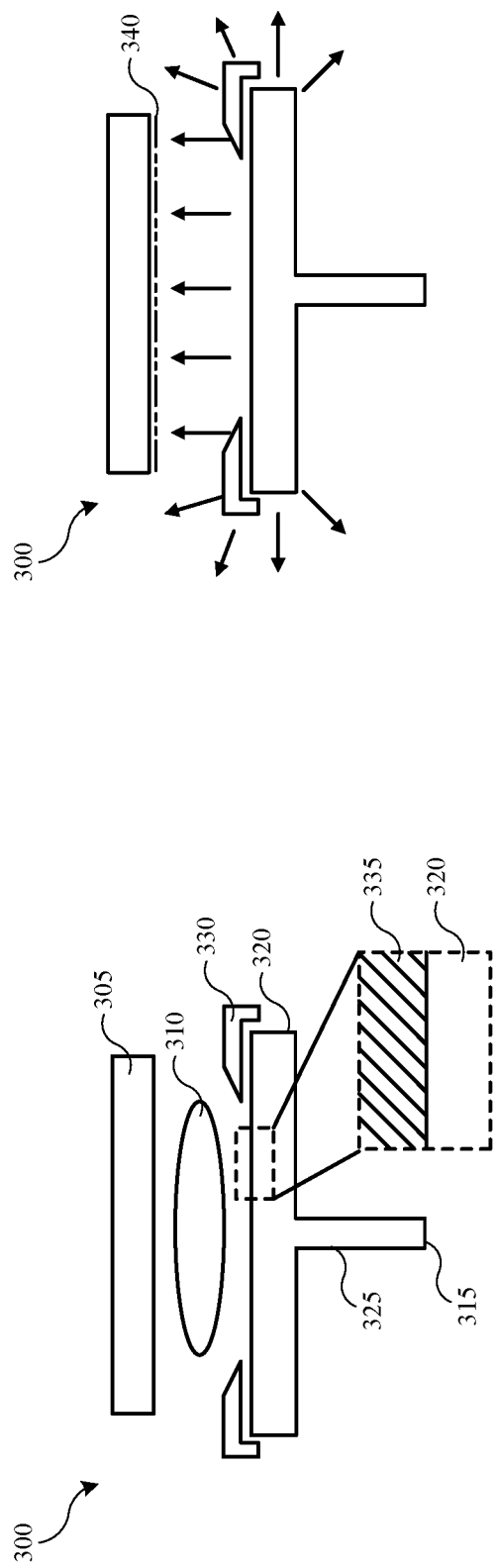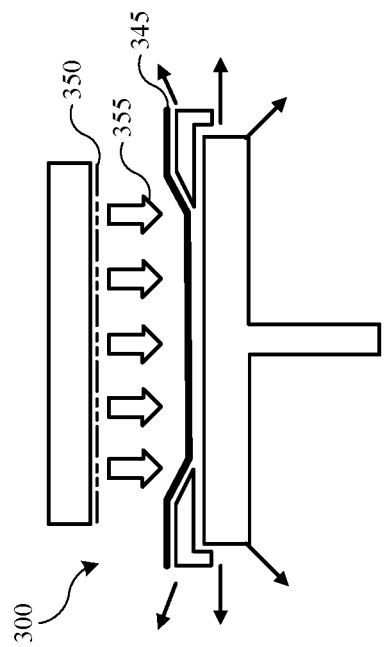

CLEAN PROCESSES FOR BORON CARBON FILM DEPOSITION

TECHNICAL FIELD

The present technology relates to systems and methods for semiconductor manufacturing. More specifically, the present technology relates to semiconductor processing methods for chamber cleaning and processing equipment.

BACKGROUND

Integrated circuits are made possible by processes which produce intricately patterned material layers on substrate surfaces. Producing patterned material on a substrate includes controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Plasma deposition and etch processes may be impacted by progressive formation of contaminant films on exposed chamber and electrode surfaces over numerous process cycles. Such contamination may introduce drift in deposition processes and may progressively impact the material properties of deposited material layers.

Thus, there is a need for improved systems and methods that can be used to produce high quality devices and structures. These and other needs are addressed by the present technology.

SUMMARY

Exemplary semiconductor processing methods may include forming a seasoning film on a heater of a processing chamber by a first deposition process. The method may include performing a hardmask deposition process in the processing chamber. The method may include cleaning the processing chamber by a first cleaning process. The method may include monitoring a gas produced during the first cleaning process. The method may include cleaning the processing chamber using a second cleaning process different from the first cleaning process. The method may also include monitoring the gas produced during the second cleaning process.

In some embodiments, monitoring the gas produced during the second cleaning process may include measuring an infrared absorbance intensity of the gas in a stream exhausted from the processing chamber. Measuring the infrared absorbance intensity may include measuring non-dispersive infrared absorbance at or about a wavelength of 4.20 μm and 4.50 μm. The method may further include estimating a first cleaning time of the first cleaning process by monitoring the gas produced during the second cleaning process. A seasoning deposition time of the first deposition process may be less than 40 seconds. The first cleaning time of the first cleaning process may be less than 80 seconds. A second cleaning time of the first cleaning process may be less than 75 seconds. A third cleaning time of the first cleaning process may be less than 50 seconds. The method may further include estimating a first electrode gap spacing of the first cleaning process by monitoring the gas produced during the second cleaning process. The first electrode gap spacing may be at least 3500 mils. The second electrode gap spacing may be at least 800 mils and less than 1000 mils. The seasoning film may be or include boron-doped carbon. The hardmask deposition process may include introducing a wafer substrate into the processing chamber. The hardmask deposition process may include forming a hardmask layer on the wafer substrate. The hardmask deposition process may include may also include removing the wafer substrate from the processing chamber.

Some embodiments of the present technology may encompass methods of semiconductor processing. The methods may include performing a plurality of processing cycles in a processing chamber. The processing cycles may include forming a first seasoning film on a heater of the processing chamber by a first deposition process. The processing cycles may include performing a hardmask deposition process in the processing chamber. The processing cycles may also include cleaning the heater. The methods may include forming a second seasoning film on the heater by a second deposition process following the plurality of processing cycles. The methods may also include cleaning the heater.

In some embodiments, the first seasoning film and the second seasoning film may be or include boron-doped carbon. The first deposition process may include depositing boron-doped carbon for a duration less than 40 seconds. The second deposition process may include depositing boron-doped carbon for a duration less than 110 seconds. Cleaning the heater may include a first cleaning time less than 80 seconds at a first electrode gap spacing exceeding 3400 mil. Cleaning the heater may include a second cleaning time less than 75 seconds at a second electrode gap spacing exceeding 700 mils and less than 1000 mils. Cleaning the heater may also include a third cleaning time less than 50 seconds at a third electrode gap spacing exceeding 4200 mils.

Some embodiments of the present technology may encompass methods of semiconductor processing. The methods may include performing a plurality of processing cycles in a processing chamber. The processing cycles may include forming a first boron-doped carbon film on a heater of the processing chamber by a first deposition process. The processing cycles may include performing a hardmask deposition process in the processing chamber. The processing cycles may also include cleaning the heater. The methods may include forming a second boron-doped carbon film on the heater by a second deposition process following the plurality of processing cycles.

In some embodiments, the semiconductor deposition process may be characterized by a deposition rate and for the plurality of processing cycles, a drift in the deposition rate may be characterized by a linear slope having a magnitude less than 0.1 Angstroms per minute per processing cycle. The hardmask deposition process may include introducing a wafer substrate into the semiconductor processing chamber. The hardmask deposition process may include forming a hardmask layer on the wafer substrate. The hardmask deposition process may also include removing the wafer substrate from the semiconductor processing chamber. A drift in a stress measurement in the hardmask layer may be characterized by a linear slope having a magnitude less than 0.06 MPa per processing cycle. The first deposition process may include depositing boron-doped carbon for a duration less than 40 seconds. The second deposition process may include depositing boron-doped carbon for a duration less than 110 seconds.

Such technology may provide numerous benefits over conventional systems and techniques. For example, embodiments of the present technology may improve process uniformity across multiple process cycles. Additionally, the methods may allow modification to accommodate any number of chambers or processes, for example, through introduction of parameter estimation techniques. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIGS. 3A-3C show a schematic cross-sectional view of an exemplary processing chamber according to some embodiments of the present technology.

Figure 1:
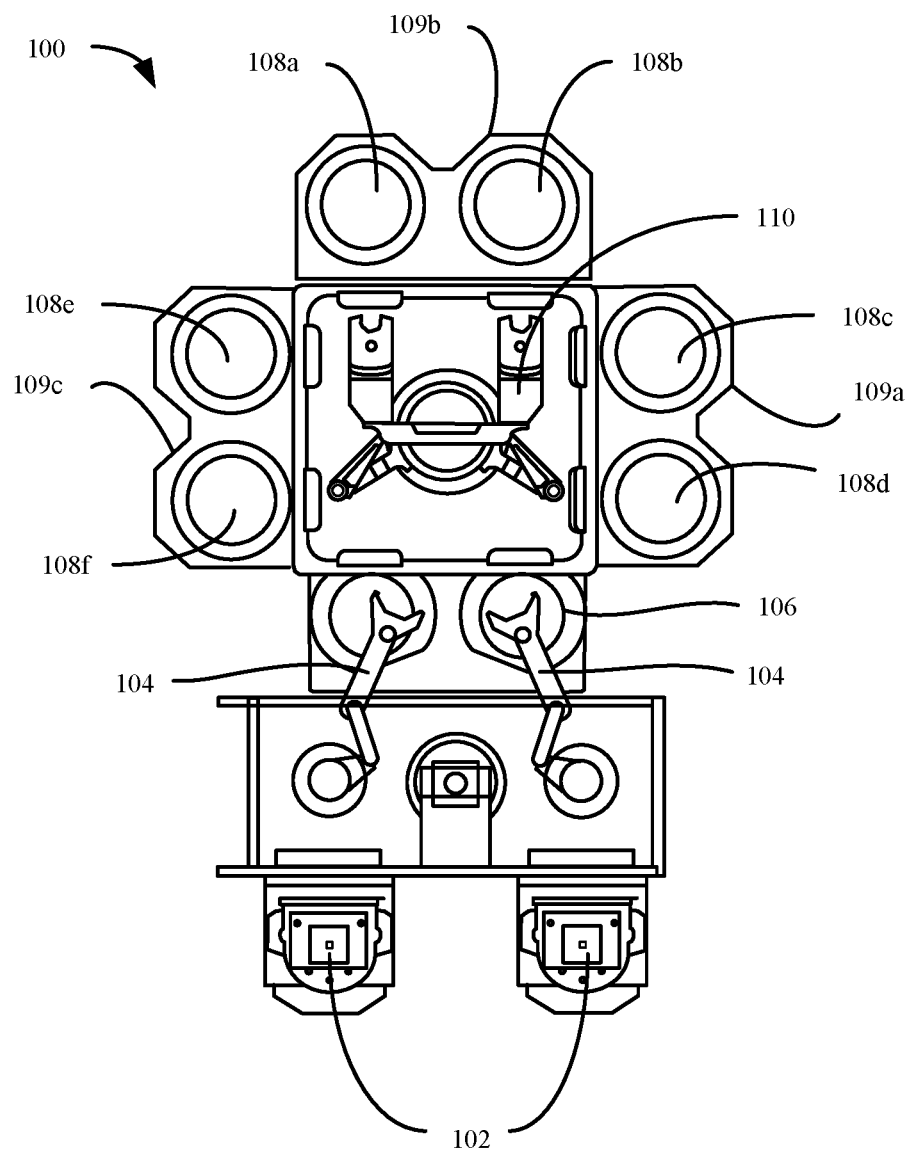
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced. Consequently, process tolerances that in part determine wafer-to-wafer consistency may also be reduced. Progressive changes in surface properties over a number of semiconductor processing cycles may develop into electrical or thermal resistances by coating interior surfaces in a processing chamber. Such coatings, in turn, may cause drift in process parameters, such as deposition rate, and material properties of deposited films, such as compressive stress. To reduce surface contamination in plasma deposition chambers, a complete process cycle may include one or more cleaning operations, including plasma-based cleaning as well as thermal desorption of films. Cleaning operations themselves, however, may redistribute contaminants from hotter surfaces to cooler surfaces, as when operating at reduced pressures such that sublimation becomes thermodynamically favored. Furthermore, many chambers include a characteristic process signature, which may result in inconsistent processing conditions. Temperature differences, flow pattern uniformity, and other aspects of processing may impact the efficacy of cleaning cycles. Cleaning process parameters including, but not limited to, timing, positions of chamber structures, seasoning film deposition, chamber temperature, or plasma parameters, may each influence the formation of contaminant films in a chamber-specific way. As such, cleaning process parameters may be monitored and modified to control for a monitored quantity that may indicate, for example, the plasma oxidation of a material that may otherwise form a sublimated coating.

In some non-limiting examples of deposition processes, plasma deposition of hardmask layers may be further impacted. For example, some carbon and/or boron-containing films may be deposited or formed by plasma processes to act as hardmasks in semiconductor patterning. To prevent contamination of the processing chamber in subsequent deposition operations, excess carbon and boron may be removed from chamber surfaces by plasma cleaning. Plasma cleaning may include forming a plasma in the chamber or from a remote plasma source that contains reactive halogen and oxygen species. The reactive species may remove contaminant films, but may also react with chamber components to form metal-halide or metal oxide films. For example, where a cleaning process includes forming a remote nitrogen trifluoride/oxygen plasma, fluorine species may react with exposed metal surfaces to form a metal-fluoride film. For example, an aluminum heater may develop an aluminum fluoride coating. Subsequently, when the heater is brought to process temperatures, such as above or about 500° C., the aluminum fluoride coating may sublimate and reform on cooler surfaces, such as a faceplate that may also act as the live electrode in an RF plasma system. The redeposited coating may introduce an impedance in the RF circuit that increases as the coating grows, resulting in a drift in plasma properties over time, thereby negatively impacting the consistency of deposition of the hardmask films. This will be described in more detail below.

The present technology overcomes these challenges during curing or cleaning cycles of semiconductor processes, as well as for any other process that may benefit from improved consistency over multiple process cycles. By implementing a method of monitoring clean cycles, increased control and uniformity of plasma deposition processes within any particular chamber may be afforded. Accordingly, the present technology may produce improved film deposition characterized by improved deposition and material property uniformity, and reduced drift, across wafer processing cycles.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
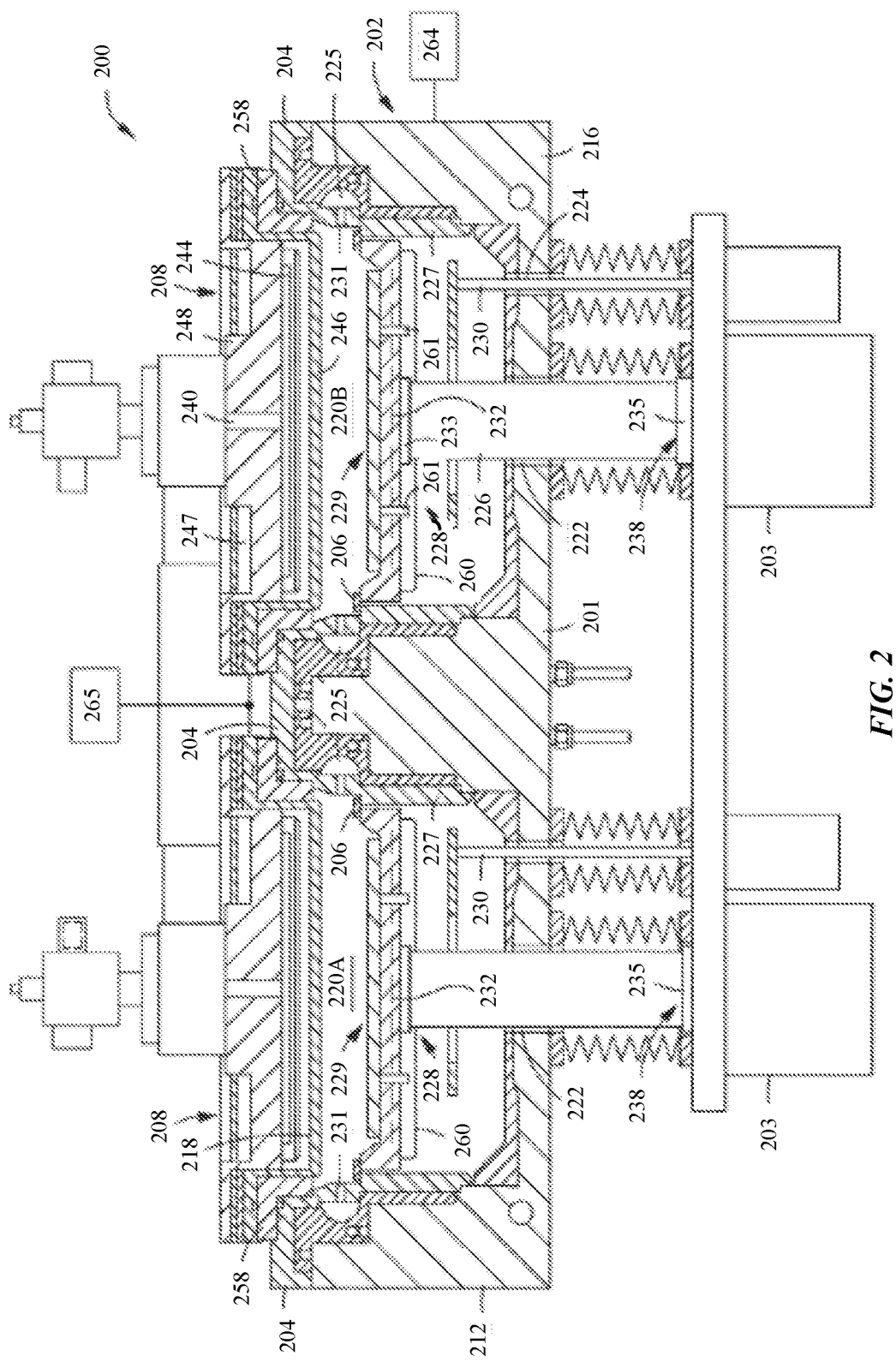
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

FIGS. 3A-3C show schematic partial cross-sectional views of an exemplary processing system 300 according to some embodiments of the present technology. FIGS. 3A-3C may illustrate further details relating to components in system 200, such as for pedestal 228 and faceplate 246. System 300 is understood to include any feature or aspect of system 200 discussed previously in some embodiments. The system 300 may be used to perform semiconductor processing operations including deposition of seasoning materials as previously described, as well as other deposition, removal, and cleaning operations. System 300 may show a partial view of the chamber components being discussed and that may be incorporated in a semiconductor processing system, and may illustrate a view across a center of the faceplate, which may otherwise be of any size. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma 310 within the processing region of the chamber. A pedestal or substrate support 315 may extend through the base of the chamber as previously discussed. The substrate support may include a support platen 320, which may support a semiconductor substrate during deposition processes, as described in more detail in reference to FIG. 4 and FIG. 5, below. The support platen 320 may be coupled with a shaft 325, which may extend through the base of the chamber. The support platen 320 may also include a heater, that may facilitate processing operations including, but not limited to, deposition, etching, annealing, or desorption. The chamber may include an edge ring 330 to center and retain a semiconductor wafer in position beneath the faceplate 305 during deposition processes, such as hardmask deposition processes. The edge ring 330 may also limit edge effects during deposition processes, as can occur during plasma deposition onto a dielectric or semiconducting substrate on a conducting base.

Through introduction of various precursor gases and control of plasma process conditions, the chamber may implement deposition processes to form hardmask layers onto wafers held on the support platen 320, as well as cleaning processes of the faceplate 305, the support platen 320, and the edge ring 330. For example, the plasma 310 may be formed with a mix of boron and carbon containing precursor gases, from which a hardmask film may be deposited, as described below. In some plasma deposition processes, hardmask material may also be deposited on exposed surfaces of the support platen 320 and the edge ring 330. Residual material may have several impacts on process consistency across multiple deposition cycles. For example, film particles may detach from chamber surfaces and damage wafers. As another example, plasma properties may be affected by the change in electrical properties of the exposed surfaces, for example, by altering surface charge accumulation. To limit such effects, the residual material may be removed by cleaning the chamber between process cycles. To clean the chamber, the plasma 310 may be formed with halogen and/or oxygen containing precursors, including a combination of these and other gases. In the context of a cleaning cycle, as described previously, reactive plasma species may be formed in the plasma 310 to react with the residual material and form gaseous byproducts that can be exhausted from the chamber using a gas-handling system.

In some embodiments, the reactive species used to clean the chamber may include halogen species that may react with metal chamber structures to form a metal halide film 335. For example, the support platen 320 may be or include aluminum, which may react with fluorine in the plasma 310 to form an aluminum fluoride film coating the exposed surfaces of support platen 320, the edge ring 330, or other surfaces. The metal halide film 335 may be relatively thin, but may nonetheless pose a challenge for process consistency and quality in several ways. As illustrated in FIG. 3B, when a metal halide film 335 is present on the surface of the support platen 320, heating of the substrate support 315 or the support platen 320 may cause the metal halide 335 film to sublimate, forming a metal halide vapor, indicated by arrows directed away from the support structure. Heating may occur as a result of exposure to the plasma 310, through phenomena such as charged particle bombardment, which may leave the support structure at an elevated temperature relative to the faceplate 305. In some cases, the support platen 320 may incorporate resistive heating elements to raise the temperature in a controlled manner.

While aspects of the support may be maintained at higher temperatures, in excess of 500° C. or higher in some cases, the faceplate 305 may be maintained at lower temperatures, such as below or about 100° C. or lower. The lower relative temperature may induce the metal halide vapor to condense and form a metal halide film 340 on the faceplate 305. Without cleaning, repeated sublimation-condensation cycles over the course of many wafer coating and chamber cleaning processes may progressively accumulate metal halide deposits on the faceplate 305, for example, by forming many layers of metal halide film 340. As described previously, the metal halide film 340 changes the electrical properties of the faceplate 305 that are exposed to the chamber, and may impact the operation of the faceplate 305 as a plasma electrode surface. While high-frequency plasma systems, such as RF plasmas, are capable in some configurations of operating without direct contact between electrodes and the plasma 310, deposits on chamber surfaces will nonetheless affect the electronic properties of the plasma 310. Consequently, it may be beneficial for process consistency to reduce the formation of the metal halide film 340 over time.

Formation of multi-layer films may pose additional challenges for processing of semiconductor wafers, for example, due to delamination of the metal halide film 340 from surfaces. Delamination or other stress-induced removal of the metal halide film 340 from the faceplate 305 may leave particles or fragments of the metal halide film 340 on wafer surfaces. Particles, whether small or large, damage the surface of a wafer, and limit the ability of structures to be formed by plasma processes, etching, lithography, or other semiconductor fabrication techniques where surface charge accumulation or line of sight govern the outcome of the techniques. This impact is in part because particles interfere with such processes, for example, by changing the interaction of a wafer with the plasma 310, the lithographic patterning from reaching the substrate correctly, or by changing the chemistry of the wafer surface.

In some embodiments, techniques may be introduced between clean and deposition processes to reduce the formation of the metal halide film 340 and thereby to reduce effects of contamination on deposition process consistency. As illustrated in FIG. 3C, the techniques may include forming a seasoning film 345 on chamber surfaces including, but not limited to, the support platen 320 or the support ring 330. Techniques to reduce sublimation of metal halide may also include forming a faceplate coating material 350 on one or more surfaces of the faceplate 350 that are exposed to the plasma 310. The faceplate coating material 350 may be or include a material that exhibits a weak interaction or affinity for metal halide films, or may otherwise inhibit the condensation of metal halide vapor through physical or chemical properties of the material. The techniques may also include introducing a purge gas 355 according to a flow pattern such that any vapor leaving the surface of the support platen 320 or the support ring 330 may be carried away from the faceplate 305 while the substrate support 315 is at elevated temperature.

In some embodiments, the seasoning film 345 may be or include boron and carbon in stoichiometric or nonstoichiometric ratios. For example, the seasoning film 345 may be or include boron carbide or boron-doped carbon. The seasoning film 345 may be formed on the surfaces of the support platen 320 and the support ring 330 by techniques compatible with semiconductor fabrication, as described in reference to FIG. 2, above. The seasoning film 345, may be formed by chemical decomposition of boron and carbon containing precursor gases and formation of the seasoning film 345 by surface deposition. In this way, the deposition time may be correlated to a thickness of the resulting seasoning film 345 through a deposition rate. In some embodiments, the thickness of the seasoning film 345 influences the extent to which the metal halide film 335 leaves the surfaces of the support structure near to the faceplate 350. The influence of the seasoning film 345 may be attributable to having a lower vapor pressure than the metal halide film 335 under similar conditions.

As described below in reference to FIG. 4 and FIG. 5, the cleaning process may also provide an approach to reducing formation of the metal halide film 340 and, consequently, reducing drift of deposition process parameters and properties of deposited hardmask layers. Through monitoring and control of clean cycle processes, the consistency of hardmask formation may be significantly improved.

Figure 4:
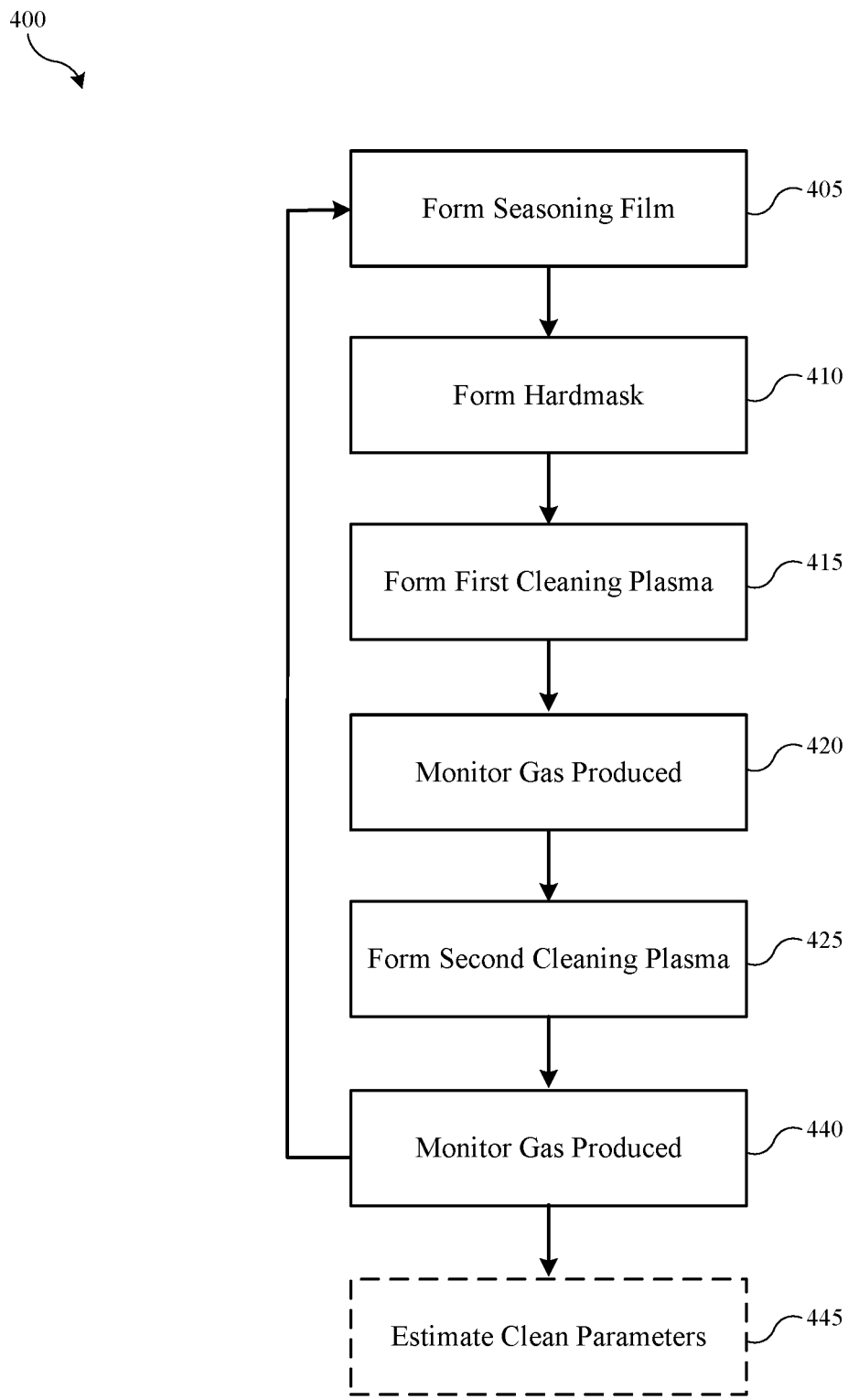
FIG. 4 shows operations of an exemplary method of semiconductor processing according to some embodiments of the present technology.

FIG. 4 shows operations of an exemplary method 400 of semiconductor processing according to some embodiments of the present technology. The method may be performed in a variety of processing chambers, including processing system 200 described above, which may include aspects of the system 300 according to embodiments of the present technology. Method 400 may include a number of optional operations, which may or may not be specifically associated with some embodiments of methods according to the present technology.

Method 400 may include a processing method that may include operations for forming a hardmask film or other deposition operations. The method may include optional operations prior to initiation of method 400, or the method may include additional operations. For example, method 400 may include operations performed in different orders than illustrated. In some embodiments, method 400 may include forming a seasoning film at operation 405. Forming the seasoning film may include introducing a precursor gas into a chamber, such as included in system 200. The system may flow the precursor gas through one or more of a gasbox, a blocker plate, or a faceplate, such as the faceplate 305 of FIGS. 3A-3C, prior to delivering the precursor into a processing region of the chamber. In some embodiments the precursor may be or include a carbon-containing precursor or a boron-containing precursor.

In some embodiments, the seasoning film may be formed by one or more film deposition techniques including, but not limited to, thermal chemical vapor deposition, plasma enhanced chemical vapor deposition, or other techniques whereby the precursor is decomposed and to form a film material. For example, a plasma may be generated of the precursors within the processing region, such as by providing RF power to the faceplate to generate a plasma. Material formed in the plasma, such as a boron and carbon containing material, may be deposited onto one or more surfaces of the chamber, such as a support platen, an edge ring, or other structures of the chamber with surfaces exposed to the plasma. Operation 405 may include a deposition time during which the seasoning film is deposited. The deposition time may correspond to the time during which the plasma is active, such that the precursor gas is decomposed only while the plasma is being generated. Corresponding to a seasoning film thickness less than or about 500 nm, less than or about 400 nm, less than or about 300 nm, less than or about 200 nm, less than or about 100 nm, or less, the deposition time in operation 405 may be less than or about 60 seconds, less than or about 50 seconds, less than or about 40 seconds, less than or about 30 seconds, less than or about 20 seconds, less than or about 10 seconds, or less. In some cases, operating parameters of the system may be relatively inflexible with regard to plasma generation, and, as such, may deposit the seasoning film at a characteristic rate less than or about 20 nm/s, less than or about 15 nm/s, less than or about 10 nm/s, less than or about 5 nm/s, or less. In this way, process factors such as the deposition time may be used to control the formation of the seasoning film.

Subsequent forming the seasoning film, operation 410 may include forming a hardmask. Forming the hardmask may include one or more constituent operations forming part of a multi-step semiconductor fabrication process. As such, forming the hard mask may include introducing a wafer substrate into the chamber, as described in reference to FIG. 1, above. The hardmask may be formed on the wafer substrate, where the hardmask may be formed by similar plasma deposition techniques described in reference to forming the seasoning layer, save with different plasma parameters or precursor gases. For example, the precursor gases may include carbon and boron precursors, such that the hardmask layer may be or include a boron-doped carbonaceous material, which may include between 1 wt. % and 95 wt. % boron. Subsequent forming the hardmask layer, the wafer substrate may be removed from the chamber in preparation for subsequent semiconductor fabrication operations. Preceding such operations, however, excess hardmask material may be removed from chamber surfaces by cleaning processes.

Subsequent forming the hardmask layer, operation 415 may include forming a first cleaning plasma in the chamber as part of a first cleaning process. The first cleaning process may include decomposing the plasma precursor gases to form reactive species, thereby converting the hardmask into gaseous species that can be removed from the chamber. In some cases, as when the hardmask includes boron-doped carbonaceous material, the first cleaning plasma may be formed by a remote plasma source and may be or include a nitrogen trifluoride/oxygen plasma ($NF_3/O_2$). In this way, the hardmask may be converted to one or more gaseous species including, but not limited to oxides of carbon or boron halides that may be removed in an exhaust gas stream from the chamber.

The first cleaning process may include multiple stages, corresponding to different cleaning times and different spacing distances between the support platen and the faceplate. In some cases, as when plasma operating parameters constrained by the plasma system, varying plasma exposure time and distance from the plasma source may expose a surface to a controlled dose of characteristic plasma species that may vary with distance from the plasma. For example, energetic plasma species may be characterized by a mean free path, over which the species may travel before one or more plasma interactions occur. In this way, varying the distance of a surface from the plasma source may change the type of energetic plasma species to which the surface is exposed and the effect of the cleaning process.

Concurrent with the first cleaning process of operation 415, gaseous reaction products may be monitored at operation 420. Techniques for monitoring species in the gas may include, but are not limited to, optical emission spectroscopy, mass spectrometry, absorbance spectroscopy, or other techniques compatible with semiconductor manufacturing processes. Optical emission spectroscopy may provide information about energized species in the plasma itself, while absorbance spectroscopy and mass spectrometry may provide information about stable species, such as those leaving the chamber in an exhaust stream. For example, non-dispersive infrared (NDIR) absorbance spectroscopy of molecular gases may be used to detect carbon dioxide in the chamber or in chamber exhaust at a foreline from the chamber. Monitoring carbon dioxide absorbance in gaseous byproducts of the cleaning process may provide an indicator of the presence of carbonaceous materials remaining on the surface of the support platen. For example, the absorbance of infrared light at wavelengths between 4.20 μm and 4.50 μm may indicate when the carbon dioxide is absent, which in turn may indicate that negligible carbon remains deposited on the chamber surfaces exposed to the plasma. Consequently, as the monitoring, or processing of data from the monitoring operation, identifies that a threshold reduction in carbon dioxide has been achieved, the cleaning operation may be halted.

Subsequent the first cleaning process at operation 415 and monitoring the gas produced at operation 420, operation 425 may include a second cleaning process. The second cleaning process may be implemented concurrently or in tandem with operation 430, including monitoring the gas produced during operation 425. The gas may be the same as the gas monitored at operation 420, such that the presence of hardmask material on chamber surfaces may be determined. The gas may be or include carbon dioxide, carbon monoxide, nitrogen oxides ($NO_x$), or other gases that may be formed in the cleaning plasma that are detectable by spectroscopic techniques, such as NDIR or OES. In some cases, the second cleaning process may be implemented using the same operating parameters as the first cleaning process. In some cases, the second cleaning process may be less aggressive than the first cleaning process, as an approach to avoiding over-cleaning the support platen. The second clean process may indicate whether the first clean process successfully removed the hardmask material by monitoring the gases produced during the second clean process. A detectable signal corresponding to the gas may indicate that the first cleaning process removed only a portion of the hardmask material.

In some embodiments, the second cleaning process may include multiple electrode gap spacing distances that may be implemented in multiple stages. For example, a first electrode gap spacing may be more than or about 2000 mils, more than or about 2500 mils, more than or about 3000 mils, more than or about 3500 mils, more than or about 4000 mils, or more. A second electrode gap spacing may be more than or about 500 mils, more than or about 600 mils, more than or about 700 mils, more than or about 800 mils, more than or about 900 mils, more than or about 1000 mils, or more. The first electrode gap spacing and the second electrode gap spacing may correspond to different stages of the second cleaning process. In some cases, a first cleaning stage may expose the surface of the support platen to longer-lived plasma species, such as ions, that may serve to heat the surface, for example, through ion bombardment. By contrast, a second cleaning stage may expose the surface to more energetic or reactive plasma species to decompose the hardmask material. In this way, the second electrode gap spacing may also be limited to a distance less than or about 1200 mils, less than or about 1100 mils, less than or about 1000 mils, less than 900 mils, less than 800 mils, or less. In some embodiments, the second cleaning process may include a third cleaning stage, where the support platen may be returned to a release position. The release position may correspond to an electrode gap spacing more than or about 3800 mils, more than or about 3900 mils, more than or about 4000 mils, more than or about 4100 mils, more than or about 4200 mils, more than or about 4300 mils, more than or about 4400 mils, more than or about 4500 mils, or more. The ordering of the stages, despite being described as first, second, and third, may be implemented differently, depending on the modification and parametric estimation implemented as part of process control strategies.

Controlling exposure to plasma generated species may also include controlling the exposure time. For example, the first cleaning stage of the second cleaning process may include a cleaning time of less than or about 100 seconds, less than or about 90 seconds, less than or about 80 seconds, less than or about 70 seconds, less than or about 60 seconds, less than or about 50 seconds, or less. Similarly, the second cleaning stage of the second cleaning process may include a cleaning time of similar duration. The third cleaning stage, by contrast may be shorter than the second cleaning time, less than or about 60 seconds, less than or about 50 seconds, less than or about 40 seconds, less than or about 30 seconds, or less.

The method 400 may optionally include multiple iterations, as part of optional operation 445, including estimating one or more parameters of the first cleaning process or the second cleaning process. Iteration, paired with reconfiguration of process parameters, may allow selective tuning of cleaning processes. Tuning the cleaning process, in turn, may permit cleaning parameters to be estimated that reduce the cleaning time, reduce the seasoning film thickness, or introduce other process economies, thereby increasing productivity and process efficiency. As an illustrative example, operation 445 may include executing a parametric design to estimate a set of cleaning parameters of the first cleaning process such that little-to-no detectable signal attributable to the gas monitored at operation 440 is found. The parametric design may include modifying seasoning film deposition time at operation 405, one or more cleaning parameters at operation 415 or at operation 425, in a controlled way. Operation 445 may be implemented autonomously, such as by process control software executed by a control system, or may include both manual and computer control.

Figure 5:
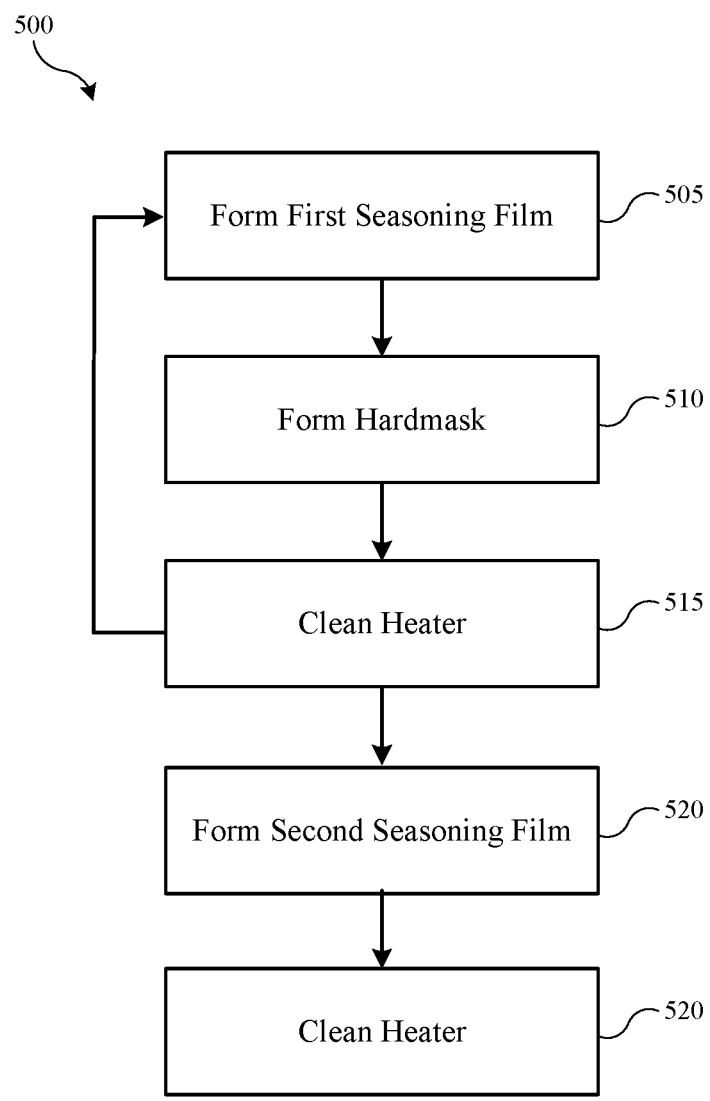
FIG. 5 shows operations of an exemplary method of semiconductor processing according to some embodiments of the present technology.

FIG. 5 shows operations of an exemplary method 500 of semiconductor processing according to some embodiments of the present technology. The method may be performed in a variety of processing chambers, including processing system 200 described above, which may include aspects of the system 300 according to embodiments of the present technology. Method 500 may include a number of optional operations, which may or may not be specifically associated with some embodiments of methods according to the present technology.

Method 500 may include a processing method that may include operations for forming a hardmask film or other deposition operations. The method may include optional operations prior to initiation of method 500, or the method may include additional operations. For example, method 500 may include operations performed in different orders than illustrated. In some embodiments, method 500 may include forming a first seasoning film at operation 505. Forming the seasoning film may include sub-operations similar to those described in reference to operation 405 above, such as a plasma decomposition of gaseous precursors and forming a film on surfaces of a processing chamber. The first seasoning film may be or include boron carbide or boron-doped carbon, and may be deposited over a deposition time less than or about 60 seconds, less than or about 50 seconds, less than or about 40 seconds, less than or about 30 seconds, less than or about 20 seconds, or less. As discussed in reference to FIG. 4, the deposition time may be coupled to the thickness of the seasoning film through a deposition rate, which may be a function of plasma system parameters. As such, the thickness of the first seasoning film may be less than or about 500 nm, less than or about 400 nm, less than or about 300 nm, less than or about 200 nm, less than or about 100 nm, or less.

Subsequent forming the first seasoning film, operation 510 may include forming a hardmask layer on a semiconductor wafer. As described in reference to FIG. 4, the hardmask may be or include a boron-doped carbon material that may be patterned in subsequent steps of semiconductor fabrication. As such, operation 510 may include sub-operations, such as introducing a wafer into the processing chamber, depositing a layer of the hardmask material, or removing the wafer with the hardmask material from the processing chamber.

Subsequent forming the hardmask, operation 515 may include a cleaning process, whereby a heater of the processing chamber may be cleaned similarly to the cleaning processes described in reference to FIGS. 3A-3C and FIG. 4. The heater of the processing chamber may describe the support platen, which, as described in reference to FIGS. 3A-3B, may incorporate internal heating elements, such as resistive heating elements. Cleaning the heater may, therefore, include exposing the support platen to a cleaning plasma including a nitrogen trifluoride/oxygen mixture. In some embodiments, the cleaning process may implement the cleaning process parameters estimated at optional operation 445 of FIG. 4.

The method 500 may include multiple iterations of operation 505, operation 510, and operation 515. The repeated cycle may form a part of semiconductor fabrication processes for multiple wafers, where the chamber may be seasoned and cleaned between a series of hardmask deposition operations. The number of iterations may correspond to a number of wafers in a process lot. For example, the lot may include more than or about 50 wafers, more than or about 60 wafers, more than or about 70 wafers, more than or about 80 wafers, more than or about 90 wafers, more than or about 100 wafers, or more.

Subsequent cleaning the heater, operation 520 may include forming a second seasoning film in the processing chamber. As described previously, the seasoning film may serve as a protective barrier to reduce sublimation of metal halide film from the heater to the faceplate of the processing chamber that may occur during an end-of-lot clean process. As in operation 505, the seasoning film may be or include boron doped carbon, and may be formed by a plasma deposition process. In contrast to operation 505, however, the second seasoning film may be formed over a longer deposition time less than or about 150 seconds, less than or about 140 seconds, less than or about 130 seconds, less than or about 120 seconds, less than or about 110 seconds, less than or about 100 seconds, less than or about 90 seconds, or less. The longer deposition time may result in a thicker seasoning film, less than or about 1.5 µm, less than or about 1.4 µm, less than or about 1.3 µm, less than or about 1.2 µm, less than or about 1.1 µm, less than or about 1.0 µm, less than or about 0.9 µm, less than or about 0.8 µm, less than or about 0.7 µm, less than or about 0.6 µm, less than or about 0.5 µm, or less.

Subsequent forming the second seasoning film, operation 520 may include cleaning the heater according to a second cleaning process. The second cleaning process may be similar to the cleaning process of operation 515 and, as such, may implement the parameters of the cleaning process described in reference to FIG. 4. Alternatively, the second cleaning process may be more aggressive than the cleaning process, which may include removing the second seasoning film, as when the second seasoning film is thicker than the first seasoning film.

Advantageously, the method 500 may significantly improve consistency of hardmask deposition processes of operation 510 across multiple iterations. For example, for a number of wafers larger than or about 50 wafers, larger than or about 100 wafers, larger than or about 150 wafers, larger than or about 200 wafers, larger than or about 250 wafers, or larger, one or more characteristics of hardmask deposition may improve by implementing the operations of method 400 and method 500. In some cases, deposition of hardmask material may exhibit improved stability and consistency across deposition operations. For example, drift of the deposition rate may be reduced by more than or about 50%, more than or about 60%, more than or about 70%, more than or about 80%, more than or about 90%, more than or about 95%, or more, over a set of deposition operations, which may include processing greater than or about 2 substrates, greater than or about 5 substrates, greater than or about 10 substrates, greater than or about 25 substrates, greater than or about 50 substrates, or more. In some cases, the drift of deposition rate, expressed as a magnitude of a linear slope relating deposition rate to wafer count, may be less than or about 0.2 Angstroms per minute per wafer, less than or about 0.15 Angstroms per minute per wafer, less than or about 0.10 Angstroms per minute per wafer, less than or about 0.05 Angstroms per minute per wafer, or less. Furthermore, one or more material properties of the hardmask itself may be improved through implementing operations of the method 400 and the method 500. For example, the compressive stress measured in the hardmask layer may exhibit improved drift across multiple iterations, expressed as a magnitude of a linear slope relating compressive stress to wafer count. The drift may be less than or about 0.1 MPa per wafer, less than or about 0.09 MPa per wafer, less than or about 0.08 MPa per wafer, less than or about 0.07 MPa per wafer, less than or about 0.06 MPa per wafer, less than or about 0.05 MPa per wafer, less than or about 0.04 MPa per wafer, less than or about 0.03 MPa per wafer, or less. The drift may also represent an improvement of more than or about 40%, more than or about 50%, more than or about 60%, more than or about 70%, more than or about 80%, more than or about 90%, or more, relative to other techniques that may not include the operations of the method 400 or the method 500.

One or more computing devices or components may be adapted to provide some of the desired functionality described herein by accessing software instructions rendered in a computer-readable form. The computing devices may process or access signals for operation of one or more of the components of the present technology, such as a monitoring system processor or controller, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may include circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing, the method comprising:
    forming a seasoning film on a heater of a processing chamber by a first deposition process;
    performing a hardmask deposition process in the processing chamber;
    cleaning the processing chamber by a first cleaning process;
    monitoring a gas produced during the first cleaning process;
    cleaning the processing chamber using a second cleaning process different from the first cleaning process; and
    monitoring the gas produced during the second cleaning process.

2. The method of claim 1, wherein monitoring the gas produced during the second cleaning process comprises:
    measuring an infrared absorbance intensity of the gas in a stream exhausted from the processing chamber.

3. The method of claim 2, wherein:
    measuring the infrared absorbance intensity comprises measuring non-dispersive infrared absorbance at or about a wavelength of 4.20 µm and 4.50 µm.

4. The method of claim 1, further comprising:
    estimating a first cleaning time of the first cleaning process by monitoring the gas produced during the second cleaning process.

5. The method of claim 4, wherein:
    a seasoning deposition time of the first deposition process is less than 40 seconds;
    the first cleaning time of the first cleaning process is less than 80 seconds;
    a second cleaning time of the first cleaning process is less than 75 seconds; and
    a third cleaning time of the first cleaning process is less than 50 seconds.

6. The method of claim 1, further comprising:
    estimating a first electrode gap spacing of the first cleaning process by monitoring the gas produced during the second cleaning process.

7. The method of claim 6, wherein:
    the first electrode gap spacing is at least 3500 mils; and
    a second electrode gap spacing is at least 800 mils and less than 1000 mils.

8. The method of claim 1, wherein the seasoning film comprises boron-doped carbon.

9. The method of claim 1, wherein the hardmask deposition process comprises:
    introducing a wafer substrate into the processing chamber;
    forming a hardmask layer on the wafer substrate; and
    removing the wafer substrate from the processing chamber.

10. A method of semiconductor processing, the method comprising:
    performing a plurality of processing cycles in a semiconductor processing chamber, the processing cycles comprising:
        forming a first boron-doped carbon film on a heater of the semiconductor processing chamber by a first deposition process;
        performing a hardmask deposition process in the semiconductor processing chamber; and
        cleaning the heater; and forming a second boron-doped carbon film on the heater by a second deposition process following the plurality of processing cycles.

11. The method of claim 10, wherein:
the semiconductor deposition process is characterized by a deposition rate; and
for the plurality of processing cycles, a drift in the deposition rate is characterized by a linear slope having a magnitude less than 0.1 Angstroms per minute per processing cycle.

12. The method of claim 10, wherein the hardmask deposition process comprises:
introducing a wafer substrate into the semiconductor processing chamber;
forming a hardmask layer on the wafer substrate; and
removing the wafer substrate from the semiconductor processing chamber.

13. The method of claim 12, wherein a drift in a stress measurement in the hardmask layer is characterized by a linear slope having a magnitude less than 0.06 MPa per processing cycle.

14. The method of claim 10, wherein the first deposition process comprises depositing boron-doped carbon for a duration less than 40 seconds.

15. The method of claim 14, wherein the second deposition process comprises depositing boron-doped carbon for a duration less than 110 seconds.

* * * * *